United States Patent
Liu et al.

(10) Patent No.: US 7,453,292 B2
(45) Date of Patent: Nov. 18, 2008

(54) RESONANT GATE DRIVE CIRCUIT WITH CENTRE-TAPPED TRANSFORMER

(75) Inventors: Yan-Fei Liu, Kingston (CA); Kai Xu, Mississauga (CA)

(73) Assignee: Queen's University at Kingston, Kingston, Ontario (CA)

( * ) Notice: Subject to any disclaimer, the term of this patent is extended or adjusted under 35 U.S.C. 154(b) by 0 days.

(21) Appl. No.: 11/593,129

(22) Filed: Nov. 6, 2006

(65) Prior Publication Data
US 2007/0109025 A1    May 17, 2007

Related U.S. Application Data

(60) Provisional application No. 60/733,213, filed on Nov. 4, 2005.

(51) Int. Cl.
  *H03K 3/00*    (2006.01)
(52) U.S. Cl. ............... 327/110; 327/108; 327/434
(58) Field of Classification Search ......... 327/108–112, 327/427, 434
  See application file for complete search history.

(56) References Cited

U.S. PATENT DOCUMENTS

| | | | |
|---|---|---|---|
| 4,567,379 A * | 1/1986 | Corey et al. ............... 327/108 |
| 5,010,261 A | 4/1991 | Steigerwald |
| 5,264,736 A | 11/1993 | Jacobson |
| 6,169,683 B1 | 1/2001 | Farrington |
| 6,208,535 B1 * | 3/2001 | Parks ............ 363/26 |
| 6,441,652 B1 * | 8/2002 | Qian ............ 327/108 |
| 6,441,673 B1 | 8/2002 | Zhang |
| 6,577,194 B2 * | 6/2003 | Delano ............ 330/251 |
| 6,650,169 B2 | 11/2003 | Faye et al. |
| 7,091,753 B2 * | 8/2006 | Inoshita ............ 327/108 |

OTHER PUBLICATIONS

Alou, P., et al., "A new driving scheme for synchronous rectifiers: single winding self-driven synchronous rectification", IEEE Trans. on Power Electronics 16(6): 803-811(2001).
Chen, Y., et al., "A resonant MOSFET gate driver with efficient energy recovery", IEEE Transactions on Power Electronics, 19(2): 470-477 (2004).
Christoph, K.J., et al., "High frequency power MOSFET gate drive considerations", High Frequency Power Conversion Conference (HFPC), 173-180 (1988).
deVries, I.D., "A resonant power MOSFET/IGBT gate driver", IEEE Applied Power Electronics Conference (APEC), 179-185 (2002).

(Continued)

*Primary Examiner*—Lincoln Donovan
*Assistant Examiner*—Hai L. Nguyen
(74) *Attorney, Agent, or Firm*—Stephen J. Scribner

(57) ABSTRACT

This invention relates to a resonant gate drive circuit for a power switching device, such as a MOSFET, that uses a center-tapped transformer to increase the driving gate voltage approximately twice as high as the supply voltage. The gate capacitance of the power switching device is charged and discharged by a constant current source, which increases the switching transition speed of the power switch. The circuit is suitable for driving a pair of low side switches with 50% duty cycle or less, such as in a variable frequency resonant converter, push-pull converter, or the like.

22 Claims, 10 Drawing Sheets

OTHER PUBLICATIONS

Diaz, J., et al., "A new family of loss-less power MOSFET drivers", Power Electronics Congress Proceedings (CIEP), 43-48 (1994).

Diaz, J., et al., "A new lossless power MOSFET driver based on simple DC/DC converters", IEEE Power Electronics Specialists Conference (PESC), 37-43 (1995).

Jacobson, B.S., "High frequency resonant gate driver with partial energy recovery", High Frequency Power Conversion Conference (HFPC), 133-141 (1993).

Lopez, T., et al., "A detailed analysis of a resonant gate driver for PWM applications", IEEE Applied Power Electronics Conference (APEC), 873-878 (2003).

Maksimovic, D., "A MOS gate drive with resonant transitions", IEEE Power Electronics Specialists Conference (PESC), 527-532 (1991).

Strydom, J.T., et al., "A comparison of fundamental gate-driver topologies for high frequency applications", IEEE Applied Power Electronics Conference (APEC), 1045-1052 (2004).

Weinberg, S.H., "A novel lossless resonant MOSFET driver", IEEE Power Electronics Specialists Conference (PESC), 1003-1010 (1992).

Wiegman, H.L.N., "A resonant pulse gate drive for high frequency applications", IEEE Applied Power Electronics Conference (APEC), 738-743 (1992).

Yao, K., et al., "A novel resonant gate driver for high frequency synchronous buck converters", IEEE Transactions on Power Electronics, 17(2): 180-186 (2002).

\* cited by examiner (a)

(b)

RESONANT GATE DRIVE CIRCUIT WITH CENTRE-TAPPED TRANSFORMER

RELATED APPLICATIONS

This application claims the benefit of the filing date of U.S. Provisional Patent Application No. 60/733,213, filed on Nov. 4, 2005, the contents of which are incorporated herein by reference in their entirety.

FIELD OF THE INVENTION

This invention relates to a resonant gate drive circuit for driving a power switching device, such as a power switch in a power converter. In particular, the invention relates to a resonant gate drive circuit that provides a high gate voltage to drive a power switching device.

BACKGROUND OF THE INVENTION

As development of computing and telecom technologies continues, high power density is increasingly required in switching power supply design. There is a trend toward increasing the switching frequency, and it will soon be in the megahertz range. Along with the benefits of higher operating switching frequency, such as compact size and faster loop response, there are also several drawbacks. An increase in gate drive loss is one drawback, since it is a frequency-related loss. The conventional gate driver circuit shown in FIG. 1 is widely used in current power converters, and includes a totem-pole pair of driving MOSFETs, Q1 and Q2, and an optional resistor between the driving MOSFETs and power MOSFET, M. Triggered by a PWM signal, the driving MOSFETs Q1 and Q2 are switched to provide the paths to charge and discharge the effective gate capacitance $C_g$ of the power MOSFET. The total gate capacitive loss can be defined as:

$$P_g = C_g \cdot (V_{CC})^2 \cdot f_S \qquad (1)$$

Where $C_g$ is effective gate capacitance of the power MOSFET, $f_S$ is the switching frequency, and $V_{CC}$ is the voltage of power source.

Equation (1) shows that the total charge stored in effective gate capacitance is proportional to the switching frequency and is completely dissipated by the gate driver. Thus, a higher switching frequency will result in increased power dissipation, which may cause the gate driver to be destroyed by overheating. Also, the gate loss takes a considerable share in total power dissipation, which reduces the efficiency of the converter significantly. In some cases, the gate loss is comparable with conduction loss [1]. Moreover, the conventional gate driver cannot meet the switching speed requirement of high frequency applications. Fast switching transition is crucial for performance of power converters, especially for low voltage, high current output converters. It can reduce switching loss and conduction loss as well. However, conventional gate driver operation is based on R-C charge and discharge characteristics. The turn-off transition increases as the voltage across the gate capacitance discharges and the discharging current falls below its peak value. Consequently, a longer turn-off transition occurs, which does not help to reduce switching loss and conduction loss. To increase the switching speed, transition paralleled gate drivers are employed in some cases. However, this results in increased component cost.

Many attempts have been made to recover gate loss energy [1]-[8]. However, such attempts are unsatisfactory or require gate control signals that are difficult to generate.

SUMMARY OF THE INVENTION

According to one aspect of the invention there is provided a resonant gate drive circuit for controlling operation of at least one power switching device having a gate capacitance, comprising: an input terminal for receiving a supply voltage; a first current source and a second current source, the first and second current sources connected in series at a node; and a plurality of switches that direct the flow of current from the first current source and the second current source, to charge and discharge the gate capacitance of the at least one power switching device, and that connect the gate capacitance of the at least one power switching device to a voltage higher than the supply voltage or to a low voltage, at a selected instant in time; wherein operation of the at least one power switching device is controlled.

In one embodiment, the first and second current sources may be first and second windings of a transformer, and the node is a centre-tap of the transformer. In a preferred embodiment, a first switch is connected between circuit ground and the first current source; a second switch is connected between circuit ground and the second current source; and a third switch is connected between the node and the supply voltage. In a further embodiment, the circuit may drive a first power switching device connected to the first current source and a second power switching device connected to the second current source. In another embodiment, the gate capacitance may be charged through a first low impedance path and discharged through a second low impedance path. In a preferred embodiment, the gate capacitance is charged with a constant current.

According to another aspect, the invention relates to a resonant gate drive circuit which may further comprise first and second power switching devices connected in series between a second input terminal and circuit ground; and a third current source connected between the gate capacitance and the source of the first power switching device; wherein the gate capacitance of the second power switching device is connected between the first switch and the first current source or between the second switch and the second current source. The first, second, and third current sources may be first, second, and third windings of a transformer, and the node may be a centre-tap of the transformer.

In another embodiment, the resonant gate drive circuit may further comprise first and second power switching devices connected in series between a second input terminal and circuit ground; a third current source connected between the gate capacitance and the source of the first power switching device; third and fourth power switching devices connected in series between a third input terminal and circuit ground; and a fourth current source connected between the gate capacitance and the source of the third power switching device; wherein the gate capacitance of the second power switching device is connected between the first switch and the first current source, and the gate capacitance of the fourth power switching device is connected between the second switch and the second current source. The first, second, third, and fourth current sources may be first, second, third, and fourth windings of a transformer, and the node may be a centre-tap of the transformer.

The low voltage may be approximately ground of the circuit. The low voltage may be equal to or less than that required to maintain the at least one power switching device in an off-state.

The at least one power switching device may comprise a plurality of power switching devices connected in parallel. The at least one power switching device may be selected from the group consisting of MOSFET, IGBT, and MCT. In one embodiment, the at least one power switching device is MOSFET.

According to another aspect of the invention there is provided a method of controlling operation of at least one power switching device having a gate capacitance, comprising:

(i) charging the gate capacitance of a power switching device using a current source, so that the power switching device is switched on;

(ii) using the current source to generate a voltage that is higher than a supply voltage, and then clamping the gate capacitance of the power switching device to the high voltage while the power switching device is on;

(iii) discharging the gate capacitance of a power switching device so that the power switching device is switched off, and then clamping the gate capacitance of the power switching device to a low voltage while the power switching device is off; and (iv) repeating steps (i) to (iii) as required to control operation of the at least one power switching device.

One embodiment may comprise carrying out steps (i) to (iv) on first and second power switching devices alternately such that the first and second power switching devices are not on simultaneously.

Clamping the gate capacitance of the power switching device to a low voltage may comprise clamping the gate capacitance approximately to ground of the circuit. In another embodiment, clamping the gate capacitance of the power switching device to a low voltage may comprise clamping the gate capacitance to a voltage that is equal to or less than that required to maintain the power switching device in an off-state.

Clamping the gate capacitance of the power switching device to a high voltage may comprise clamping the gate capacitance to a voltage that is approximately two times the supply voltage.

In another embodiment, the method may further comprise charging the gate capacitance via a first low impedance path, and discharging the gate capacitance via a second low impedance path.

BRIEF DESCRIPTION OF THE DRAWINGS

For better understanding of the invention and to show more clearly how it may be carried into effect, reference will be made, by way of example, to the accompanying drawings which show preferred embodiments of the invention and in which.

DETAILED DESCRIPTION OF PREFERRED EMBODIMENTS

Figure 1:
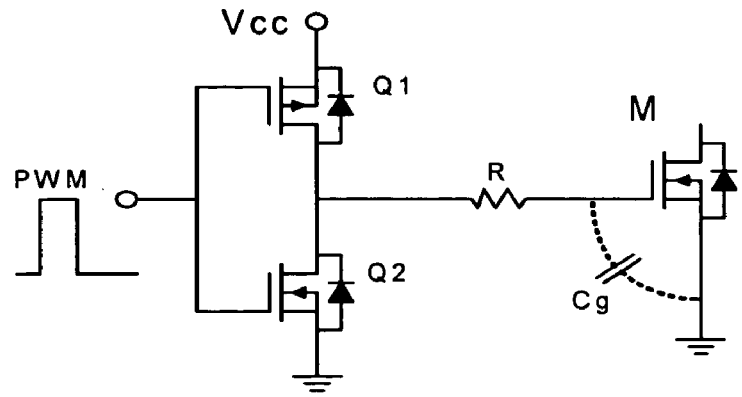
FIG. 1 is a schematic diagram of a gate drive circuit according to the prior art.

The inventors describe useful resonant gate drive circuits in co-pending U.S. application Ser. No. 11/045,055, filed Jan. 31, 2005, and in co-pending U.S. application Ser. No. 11/266,486, filed Nov. 4, 2005, the contents of which are incorporated herein by reference in their entirety.

For the purpose of this description, the term MOSFET will be used as a non-limiting example for all switching devices. It will be understood that other suitable devices, such as, for example, IGBT (insulated gate bipolar transistor), or MCT (MOS controlled thyristor) may also be used.

As known in the art, such switching devices have capacitance associated with their control terminal, or gate. For example, a MOSFET has a gate capacitance. As used herein, the terms "$C_g$" and "gate capacitance" refer to the capacitance, or gate capacitor, of such switching devices. Expressions such as "connected to the gate capacitance" and "connected to the gate capacitor" refer to a connection to the gate or control terminal of such switching devices.

As used herein, the term "current source" is intended to refer to an idealized current source which may be approximated by at least a portion of the magnetizing current of a transformer winding, a current through an inductor, or the like.

By one aspect, the invention relates to a resonant gate drive circuit that is suitable for driving a pair of low side power switching devices with a 50% duty cycle or less, such as in a variable frequency resonant converter, a push-pull converter, and the like. The invention is particularly suitable for driving the synchronous rectifiers in a resonant converter. In some embodiments the invention may be used to drive a single power switch, in which case a capacitor, and optionally a series resistor, replaces the second power switch. A centre-tapped transformer is utilized to obtain gate voltages higher than the supply voltage. This provides a substantially high gate voltage when the power supply voltage is at a lower voltage, such as a logic voltage level. The high gate voltage reduces conduction loss of the power switching device. One embodiment employs a centre-tapped transformer with a turns ratio of 1:1, which provides a gate voltage of approximately twice the supply voltage. In other embodiments a centre-tapped transformer with a turns ratio other than 1:1 may be used to provide gate voltages at other multiples of the supply voltage, For example, a turns ratio of 1:2 provides a gate voltage of three times the supply voltage on one side, and one-half the supply voltage on the other side. Such an embodiment is useful in applications, for example, where the circuit is used to drive a single power switching device, where a capacitor rather than a power switch would be connected to the lower voltage side.

A substantially constant high current source is used to charge and discharge the gate capacitances of the power switching devices, and drive the power switching devices to achieve a higher driving speed and also to recover gate drive energy. The term "substantially constant high current" refers to a current higher than an initial charging current in the current source. The constant current source also decreases switching transition times of the power switching devices, particularly the turn-off transition. Moreover, by adding two more windings to the centre-tapped transformer, the circuit may be adapted to drive high side power switching devices in full bridge or half bridge configuration for a variable frequency resonant converter.

Figure 2:
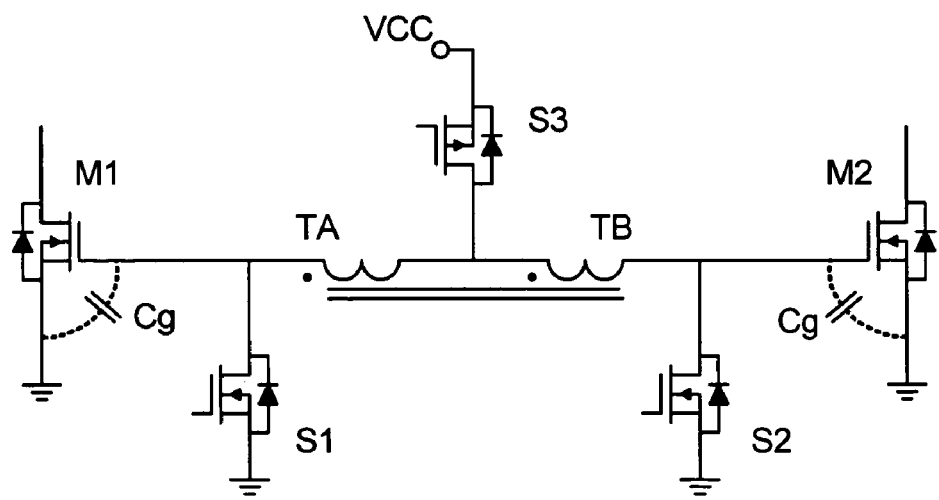
FIG. 2 is a schematic diagram of a resonant gate drive circuit according to an embodiment of the invention.

FIG. 2 shows an embodiment of a resonant gate drive circuit of the invention. The circuit consists of three driving switches S1 to S3, which may be MOSFET or other suitable device. In FIG. 2, S1 and S2 are N-channel MOSFETs, and S3 is a P-channel MOSFET. The centre tap of the transformer is connected to the power source $V_{CC}$ through S3. The turns ratio of windings TA and TB of the transformer is 1:1. M1 and M2 are power switching devices, such as MOSFETs. $C_g$ is the gate capacitance of the power MOSFET.

Figure 3:
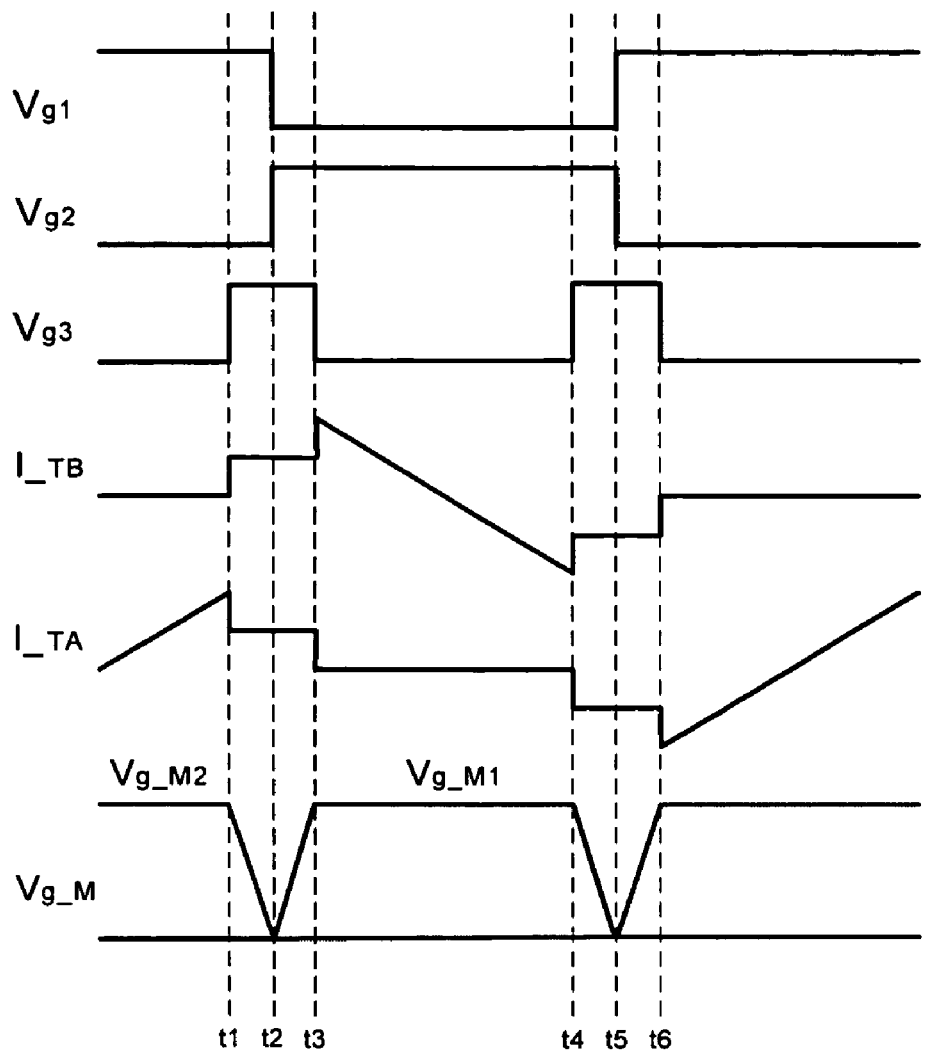
FIG. 3 is a plot showing key waveforms of the operation of the circuit of FIG. 2.
Figure 4:
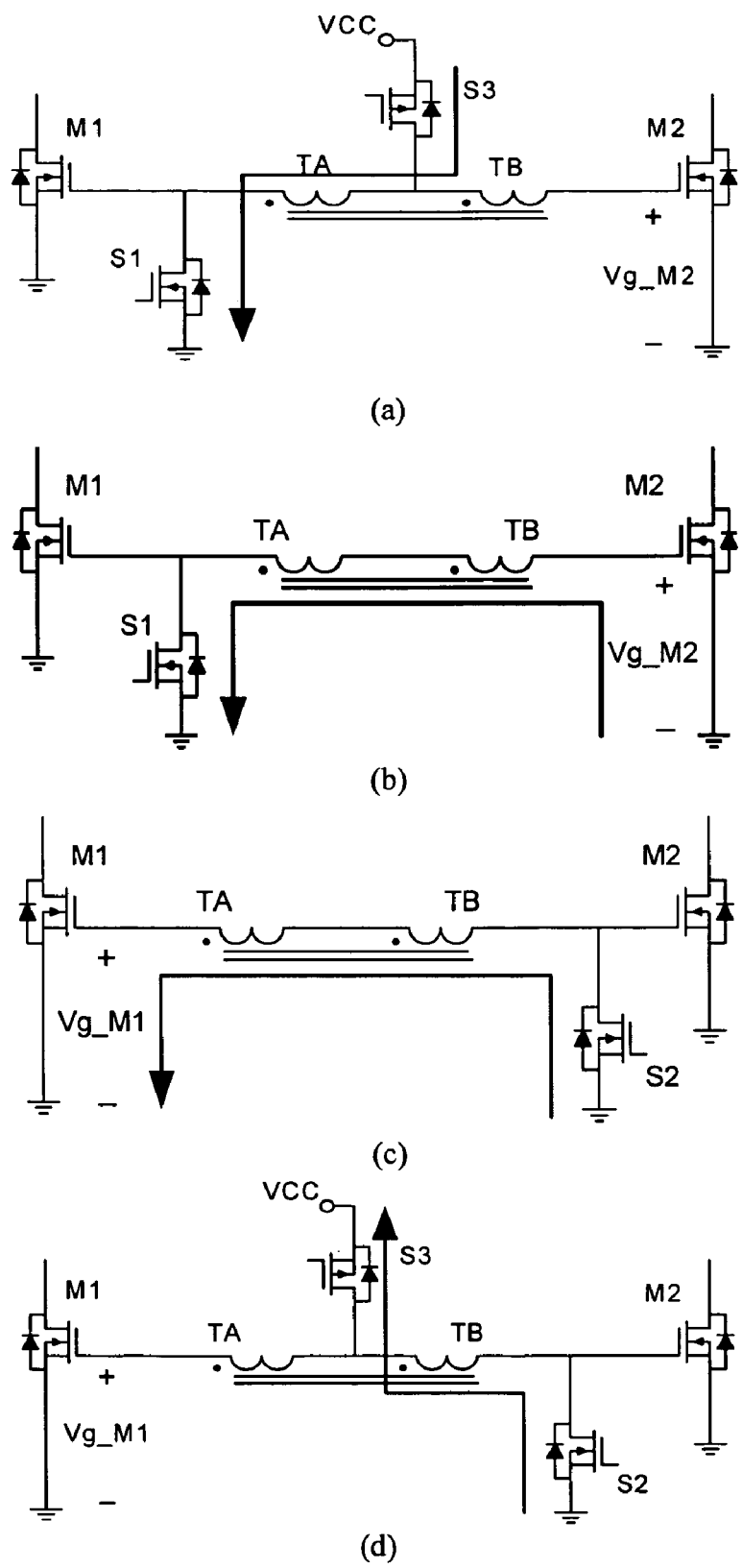
FIG. 4(a) to (d) are circuit diagrams showing key operational stages of the circuit of FIG. 2: (a) M1 turned off and M2 turned on (before t1), (b) M2 turning off (t1~t2), (c) M1 turning on (t2~t3), and (d) M2 turned off and M1 turned on (after t3)

FIG. 3 shows key operating waveforms of the embodiment shown in FIG. 2. FIG. 4 illustrates the circuit operation in each stage. Operation of the circuit of FIG. 2 will now be described with reference to FIGS. 3 and 4.

Assume initially, before t1, that S1 and S3 are on. Power MOSFET M1 is off, and M2 is on. Winding TA of the transformer is linearly charged. A voltage is induced in winding TB, which is combined with the voltage of winding TA to drive the gate voltage of M2 up to approximately twice the Vcc voltage.

At t1, an M2 switch off signal arrives. S3 is turned off. The magnetizing current keeps flowing in the same direction, such that half of the current circulates into winding TA, which induces current in winding TB. The other half of the current keeps flowing in the same direction through S1, Cg of M2, TB, and then returns to TA. Cg of M2 is discharged by an approximate current source at about one-half of the peak magnetizing inductance current. As long as the voltage on Cg of M2 is discharged below the threshold turn-off voltage of M2, M2 is turned off. The voltage on Cg of M2 continues to be discharged to zero, and the body diode of S1 conducts the current and S2 is turned on with zero voltage switching (ZVS).

At t2, S2 is turned on with ZVS and S1 is turned off. Magnetizing current continues to flow, now charging Cg of M1. The voltage across each winding of the transformer increases as Cg is charged until the voltage on winding TB climbs over the Vcc voltage. At that moment, the body diode of S3 starts conducting current, and the centre voltage of the transformer is clamped at Vcc via the body diode of S3. The gate of M1 is therefore clamped at two times the supply voltage Vcc. Since the body diode of S3 is conducting, switch S3 is turned on with ZVS.

At t3, with an appropriate time delay from t2, S3 is turned on with ZVS. Winding TB is then linearly charged. The gate voltage of M1 is boosted to twice the Vcc voltage.

The operating principle during the second half of the switching period (i.e., from t4 to t6) is the same as from t1 to t3, except that the current direction is reversed.

From the above description it will be appreciated that by controlling the timing of S1 and S2, the gate voltages of a pair of power MOSFETs can be arranged in an overlap mode, a critical mode, or a delay mode to satisfy different applications of the gate drive circuit. The operation mode shown in FIG. 3 is a critical mode where a first power MOSFET is turned on right after a second power MOSFET is turned off.

According to this embodiment, a centre-tapped transformer is used to obtain gate voltages as high as approximately twice the supply voltage Vcc. This advantageously allows the gate voltage to reach a high voltage level even when the voltage of the power source is at a low level, such as, for example, a logic level of 2.5 V, and thereby reduces conduction loss of the power switch. For example, in certain telecom applications in which there is no 12 V intermediate bus and the output rail voltage is set at 2.5 V or 3.3 V, by using the resonant gate driver of the invention, the gate voltage of a MOSFET in a circuit powered by such an output rail may reach a relatively high level without the need for an extra circuit. Also, control logic signals of the circuit described herein are relatively straight-forward to design and implement (see, for example, FIG. 6).

The resonant gate drive circuit was designed not only to recover much of the gate energy, so as to improve the driving efficiency, but also to realize a faster driver. A faster driver reduces the switching loss of the power switching devices. In the resonant gate drive circuit, the gate capacitance of the power MOSFETs Cg is charged and discharged by an approximately constant current during the transit time between two switches, shown in FIG. 3, from t1 to t3. Using a current source to drive the MOSFETs provides a much faster driving speed relative to a conventional driver at same current level. Further, it overcomes the drawback of a slow turn-off time, typical of conventional drivers.

However, faster driving speed requires higher driving current, which in turn may cause conduction loss to increase substantially. This is because of the resulting power dissipation by the internal resistance Rg of the power switching device. Therefore, to design the resonant gate driver, the driving speed and driving current are the main parameters to be determined. The trade-off between driving speed and driving current should be considered. The relationship between speed and driving current is expressed in equation (2):

$$I_{ped} = \frac{2 \cdot V_{CC} \cdot C_g}{T_t}, \qquad (2)$$

$$I_{ped} = \frac{I_{pk}}{2}$$

where $I_{ped}$ is pedestal current that charges and discharges the gate capacitance Cg of the power switching device.

Figure 5:
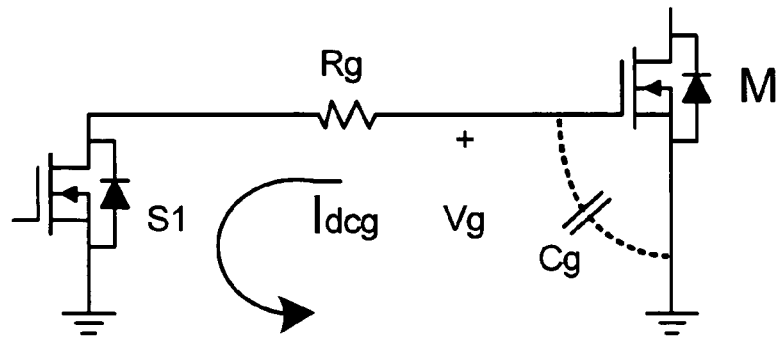
FIG. 5 is a schematic diagram showing an equivalent circuit of the resonant gate drive circuit of FIG. 2 during discharging of the gate capacitance of a power switching device.

Another consideration in determining the constant driving current is that the setting current may be limited at a certain value because the voltage across the internal resistance Rg prevents the power switching device from turning off. For example, as shown in FIG. 5, when S1 is turned off, a constant current $I_{dcg}$ discharges Cg. When the discharge current is high enough, the actual gate voltage Vg of M could be higher than the threshold off voltage of the power switching device, preventing it from being properly turned off. As a result, shoot-through of a pair of MOSFETs, and consequent component failure, may occur. For a power MOSFET with 1 to 2Ω internal gate resistance and a 1.8 V threshold voltage, a limited driving current is about 1 to 1.5 A. MOSFETs connected in parallel may relax this limitation.

When the pedestal current $I_{ped}$ is determined, the magnetizing inductance can be obtained from equation (3):

$$L_m = \frac{V_{CC} \cdot \left(\frac{T_S - T_t}{2}\right)}{2 \cdot I_{pk}} \quad (3)$$

where $L_m$ is the magnetizing inductance of the transformer.

In high frequency applications (e.g., frequencies greater than 1 MHz), the magnetizing inductance is normally small, for example, in the range of a few hundred nH. Optionally, an air core transformer may be used, to eliminate the core loss of the transformer. The centre-tapped transformer may also be implemented as a coupled inductor, for example, using a bifilar wire winding construction, to reduce leakage inductance.

By another aspect, the invention relates to a resonant gate drive circuit that is suitable for driving the low side and the high side power switching devices with a 50% duty cycle, or less, in a half bridge or a full bridge DC-DC converter, such as a variable frequency resonant converter, a phase shift control resonant converter, a Buck converter, or the like. The invention is also suitable for driving the synchronous rectifiers in a resonant converter. A centre-tapped transformer is utilized to obtain a gate voltage as high as twice the supply voltage Vcc, and a third winding is used to drive the high side MOSFET. The resonant gate drive circuit recovers gate energy and also reduces switching loss. The logic control circuit is located at the circuit low side, eliminating the need for a level shift circuit and its associated drawbacks. Further, the logic circuit may be of a simple design and is easy to implement.

Figure 12:
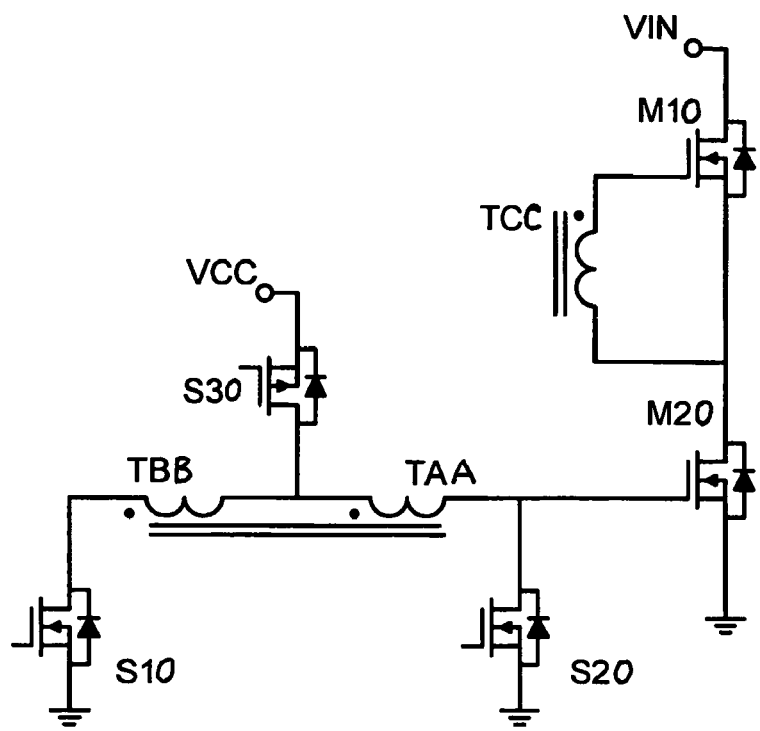
FIG. 12 is a schematic diagram of a resonant gate drive circuit according to another embodiment of the invention.

FIG. 12 shows an embodiment of such a resonant gate drive circuit for a half-bridge voltage converter application. The circuit includes three driving switches S10 to S30, such as MOSFETs, and a centre-tapped transformer with windings TAA and TBB. The junction of windings TAA and TBB of the transformer is connected to a power supply Vcc through S30. The third winding TCC is directly connected between the gate and source of the high side MOSFET M10, whereas the gate of the low side MOSFET M20 is connected to winding TAA. The polarities of the windings are indicated in FIG. 12.

Figure 13:
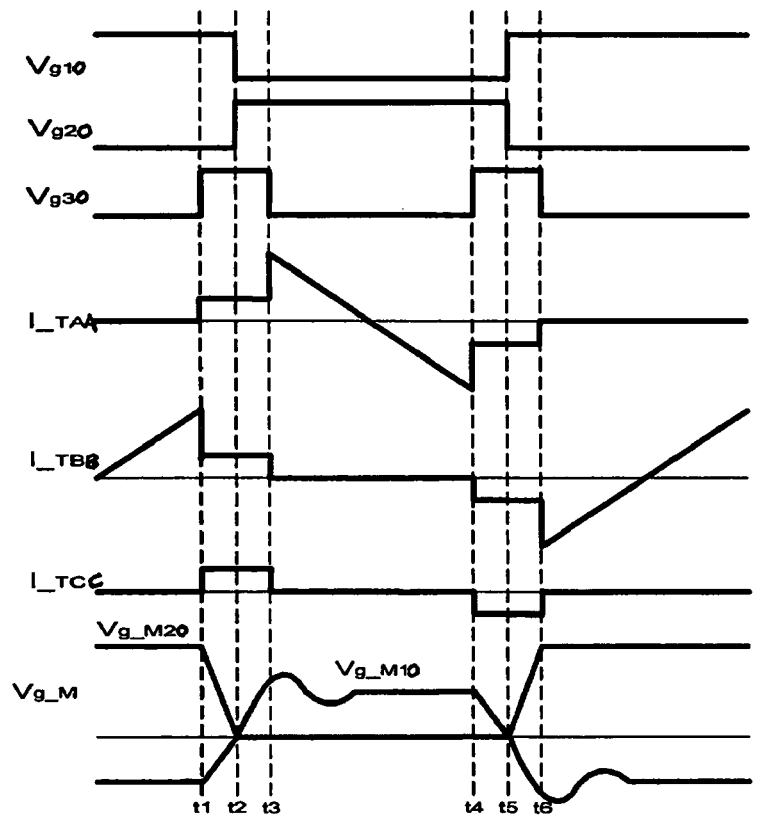
FIG. 13 shows key waveforms of the operation of the circuit of FIG. 12.

In FIG. 12, S10 and S20 are N-channel MOSFETs and S30 is a P-channel MOSFET. The turns ratio of windings TAA and TBB of the transformer is 1:1. The turns ratio between TAA and TCC can be set as the circuit performance requires. To simplify the analysis below, the three windings were set with same turns. FIG. 13 shows the key operating waveforms.

The circuit operation will now be described with reference to FIGS. 12 and 13. Assume initially, before t1, that S10 and S30 are on. A negative voltage is applied to the gate of MOSFET M10. M10 is off, whereas M20 is on. Winding TBB of the transformer is linearly charged. A voltage is induced in winding TBB, which is added to the voltage of winding TAA to the drive gate voltage of M20 to twice the Vcc voltage.

At t1, an M20 switch off signal arrives. S30 is turned off. Magnetizing current keeps flowing in same direction, and is reduced by two thirds in the winding TBB, which induces current in windings TAA and TCC. One third of the current keeps flowing in the same direction through S10, effective capacitance Cg of M20, TAA, and then returns to TBB. Cg of M20 is discharged at about ⅓ of the peak magnetizing inductance current. Meanwhile, ⅓ of the peak magnetizing inductance current induced in winding TCC charges Cg of M10 towards zero from a negative value. As long as the voltage on Cg of M20 is discharged below the gate threshold, M20 is turned off. The voltage on Cg of M20 continues to be discharged to zero, the body diode of S20 conducts the current and S20 can be turned on at ZVS.

At t2, S20 is turned on at ZVS. The gate-source voltage of M10 reaches zero. Now S10 is turned off and theoretically Cg of M10 can be charged. However, Cg of M10 is charged in a different manner because of the leakage inductance of the transformer. When S10 is turned off, due to the small amount of output capacitance of S10, the voltage across S10 is charged by a magnetizing current and reaches its maximum value immediately. The voltage on winding TCC clamps, and the leakage inductance of the transformer and Cg of M10 begin to resonate. In addition, the leakage inductance current will speed up the turn-on transition of M10. Because the winding voltage clamps, the body diode of S30 starts conducting current, and switch S30 can be turned on at ZVS.

At t3, with an appropriate time delay from t2, S30 is turned on at ZVS. Then winding TAA is linearly charged. The gate voltage of M10 is at the Vcc voltage.

At t4, the moment to start turning off M10, S30 is turned off. The current induced in winding TBB quickly discharges the output capacitance of S10 to zero, the body diode of S10 conducts the current, and voltages across the transformer windings become zero. The leakage inductance starts to resonate with Cg of M10 and discharges the gate capacitance. When the voltage on Cg of M10 is discharged below threshold, M10 is turned off. M20 is turned on at this moment.

At t5, S20 is turned off. Cg of M20 is charged to one third of the peak magnetizing current while Cg of M10 is also discharged to a negative value. The voltage across each winding of the transformer keeps increasing, until the voltage on winding TAA exceeds the Vcc voltage. At that moment, the body diode of S30 starts conducting current. S30 is turned on at ZVS.

At t6, S30 is turn on at ZVS, and winding TBB is linearly charged. The gate voltage of M10 is boosted to twice the Vcc voltage. The next switching cycle then begins.

The total loss of the resonant gate drive circuit of FIG. 12 is includes conduction loss, driving loss, and transformer core loss. Of these losses, conduction loss is the major loss. Since the total gate charge of the driving switches is small, driving losses constitute only a small part of the total loss. Further, because the driving MOSFETs realize the ZVS, switching loss of these MOSFETs can be neglected. By choosing high frequency core material and an optimal turns of transformer windings (based on circuit performance requirements), the core loss of the transformer may be minimized.

The resonant gate driver of FIG. 12 not only recovers much of the gate energy, improving the driving efficiency, but also ensures a faster driving speed. A faster driver will contribute to reducing switching loss. However, faster driving speed requires higher driving current, which may cause conduction loss to increase. Conduction loss results from the power dissipation of the internal resistance Rg in the power MOSFET. In designing this resonant gate driver, the trade-off between driving speed and driving current is considered.

Figure 16:
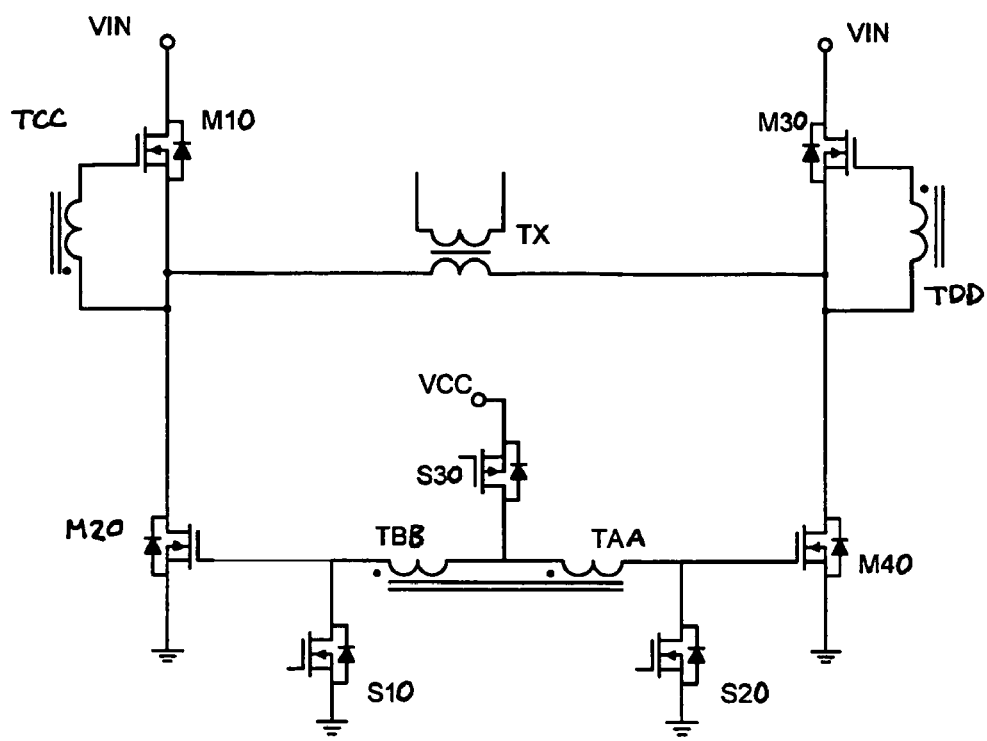
FIG. 16 is a schematic diagram of a resonant gate drive circuit according to another embodiment of the invention.

FIG. 16 shows another embodiment of a resonant gate drive circuit for driving the low side and the high side power switching devices, in, for example, a full-bridge voltage converter application. The circuit is similar to the half-bridge circuit of FIG. 12, but includes additional power switches M30 and M40, and a fourth winding TDD. The main transformer TX is shown connected between the sources of M10 and M30.

The invention will be further described by way of the following non-limiting examples.

EXAMPLE 1

Figure 7:
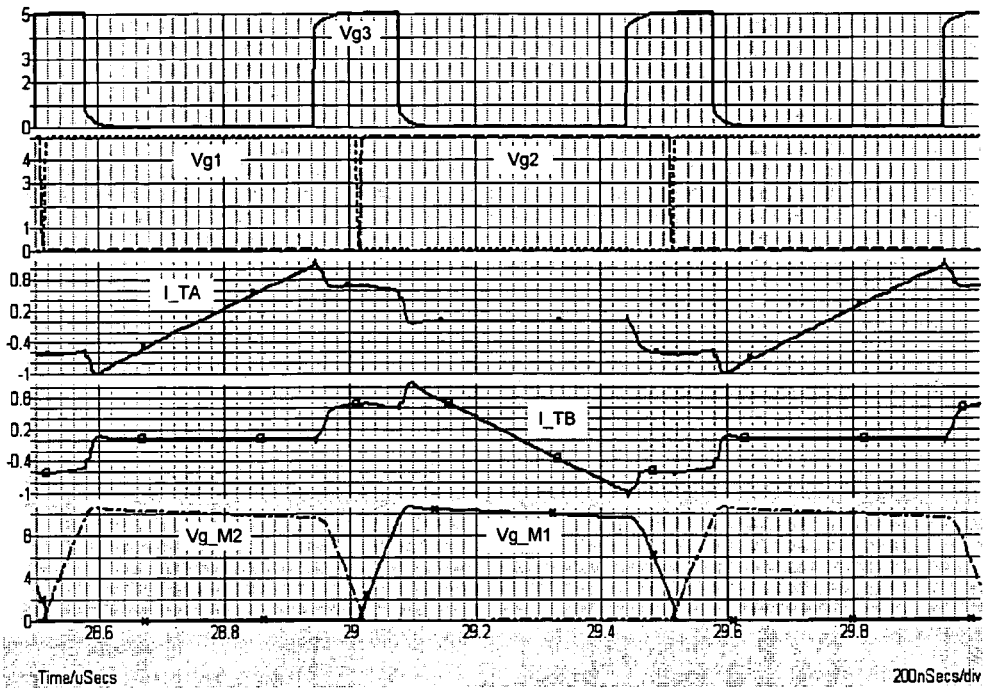
FIG. 7 is a plot of the results of a simulation of a resonant gate drive circuit for a switching frequency fs=1 MHz.
Figure 8:
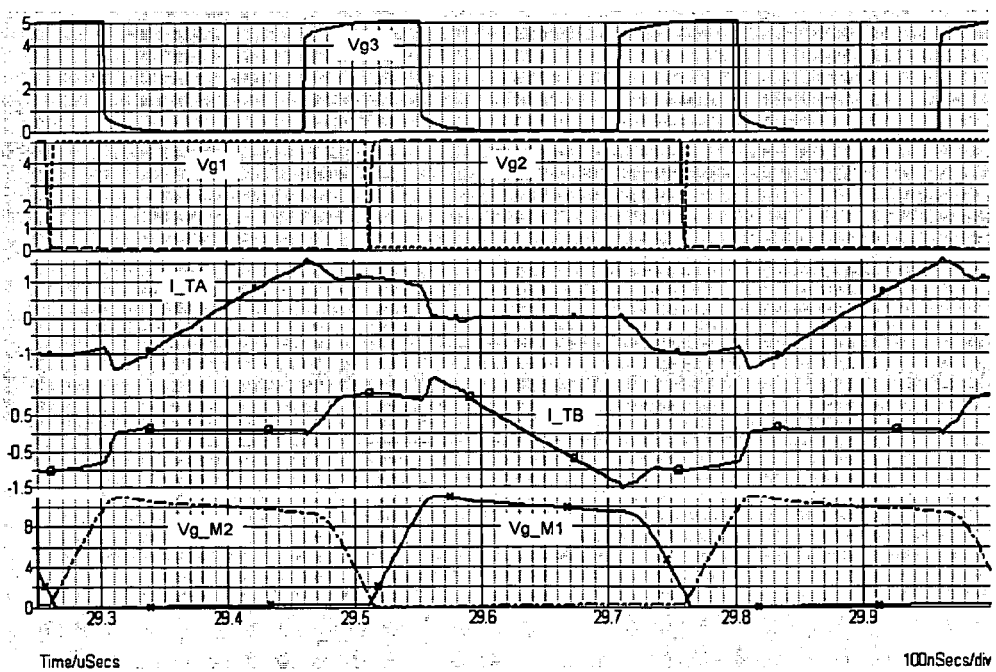
FIG. 8 is a plot of the results of a simulation of a resonant gate drive circuit for a switching frequency fs=2 MHz.

A computer simulation was done to evaluate the resonant gate driver circuit of FIG. 2. The simulation results at switching frequencies of 1 MHz and 2 MHz are shown in FIGS. 7 and 8, respectively. The simulation conditions were as follows:

The supply voltage Vcc was 5 V. Switching frequencies were set at 1 MHz and 2 MHz, and corresponding magnetizing inductances were 900 nH and 250 nH, respectively. A 3.9 nF capacitor was used to simulate the gate capacitance of the power MOSFET. It was assumed that there was no leakage inductance.

Figure 6:
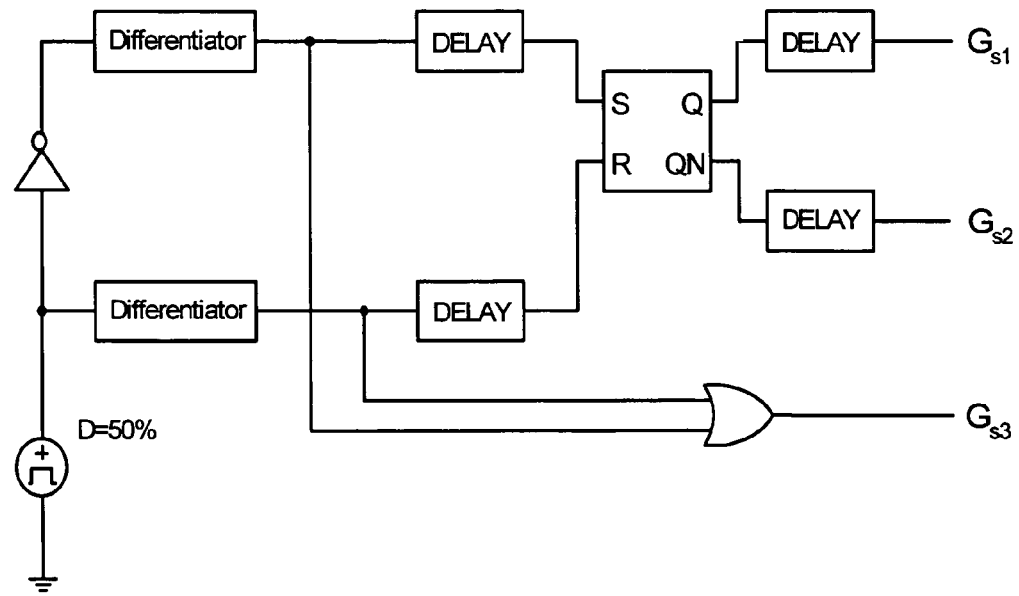
FIG. 6 is a block diagram of a logic control circuit for a resonant gate drive circuit.

A prototype of the resonant gate driver circuit was built. The voltage of the power supply was 5 V and the clock frequency was set at 1 MHz. All logic circuitry was implemented using discrete gate components. FIG. 6 shows the logic circuit for the driver. A toroid core transformer (Micrometals T44-15) was used for the centre-tapped transformer, in which a bifilar wire winding construction was employed to minimize leakage inductance. The magnetizing inductance was 900 nH. MOSFETs with small total gate charge were chosen for S1 to S3 (Fairchild FDN335N for S1, S2 and FDN308P for S3).

Figure 9:
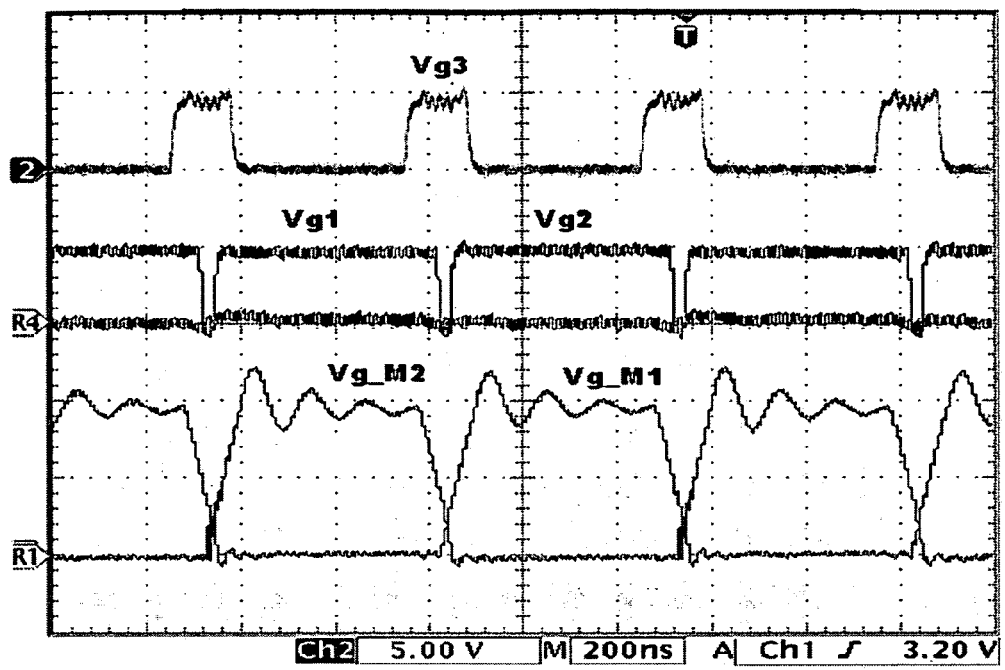
FIG. 9 is a plot of experimental results for a resonant gate drive circuit with fs=1 MHz and a series capacitor and resistor as a load.
Figure 10:
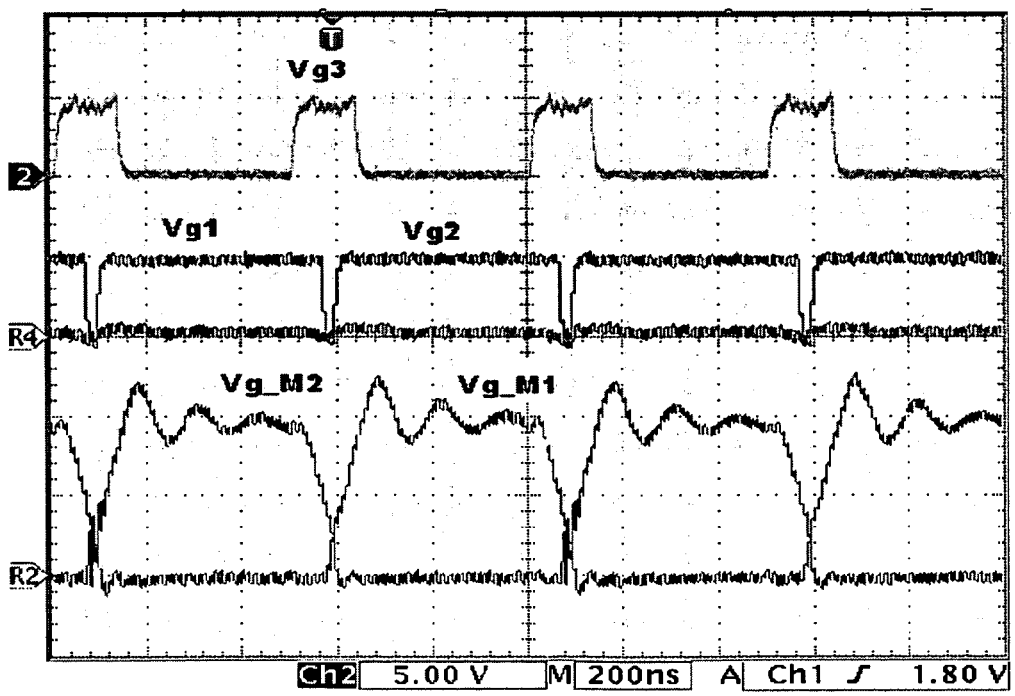
FIG. 10 is a plot of experimental results for a resonant gate drive circuit with fs=1 MHz and a load on each side of two MOSFETs connected in parallel.

Two conditions were tested. For the first condition, a 3.9 nF ceramic capacitor was used as a circuit load with a resistor in series to simulate the internal resistance Rg of a MOSFET. For the second condition, two power MOSFETs connected in parallel were used as a circuit load on each side of the resonant gate driver circuit. The Fairchild FDS4410 was selected for the power MOSFET. FIGS. 9 and 10 show the waveforms for the two conditions, respectively. Both conditions were working in overlap mode. The ringing on the gate voltage $V_{g\_M}$ evident in the figures was caused by the leakage inductance of the transformer. As can be seen from the results, the gate voltages were boosted to about 10 V, twice the supply voltage of 5 V.

For the case of the capacitor load, a resistor was connected in series with the capacitor to represent the internal gate resistance Rg of a MOSFET. Also, the resistor damped the circuit, so that steady state measurements could be obtained. For FIG. 9, the series resistance was 0.22Ω and the measured loss of the circuit was 255 mW. In comparison, the total loss for a conventional driver is 712 mW. The difference represents a loss saving of 64%.

Figure 11:
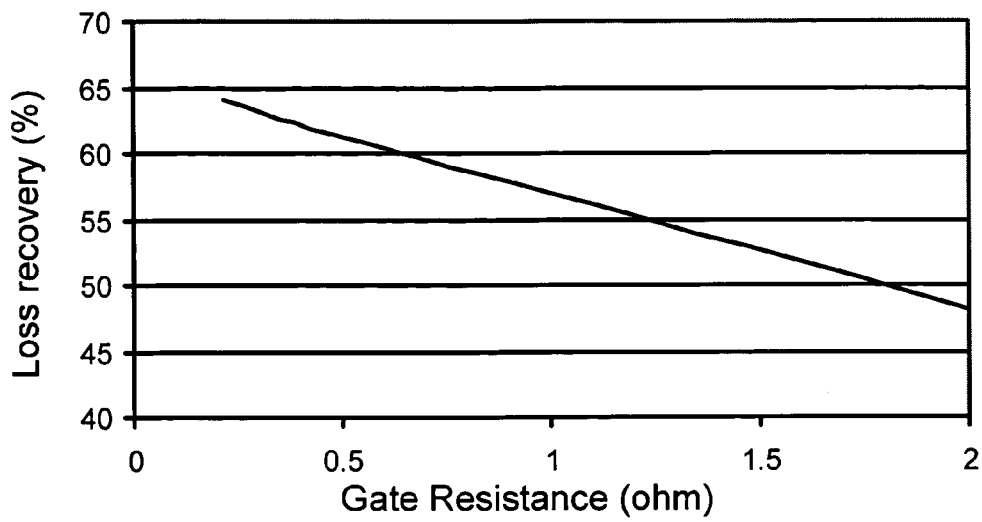
FIG. 11(a) is a plot of the measured loss recovery of an experimental resonant gate drive circuit for various gate resistances.
FIG. 11(b) is a plot of the calculated loss recovery.
Figure 11:
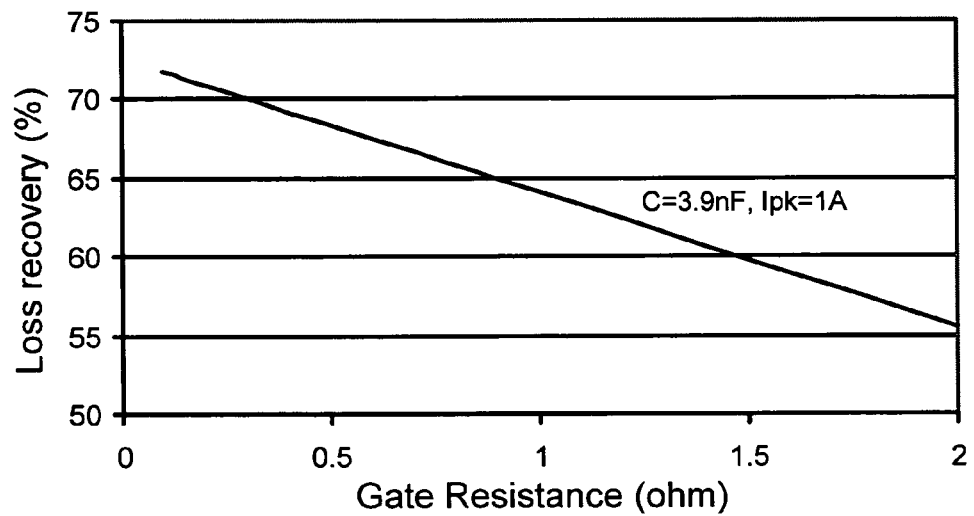

The loss saving using different series resistors was also measured. FIG. 11(a) characterizes the measured energy saving of the resonant gate driver with different series resistors (i.e., different values of gate resistance Rg). The measured loss saving matches the calculated saving shown in FIG. 11(b), with a small error of about 7% between the calculated and the measured results.

For the case of the MOSFET load, the typical gate capacitance obtained from the datasheet for the device was used to calculate a circuit loss saving of 48%, where the total gate loss was 514 mW and the circuit loss was 267 mW.

From the experimental results it is observed that the internal gate resistance of the power switching device has a substantial impact on the performance of the resonant gate drive circuit.

EXAMPLE 2

Figure 14:
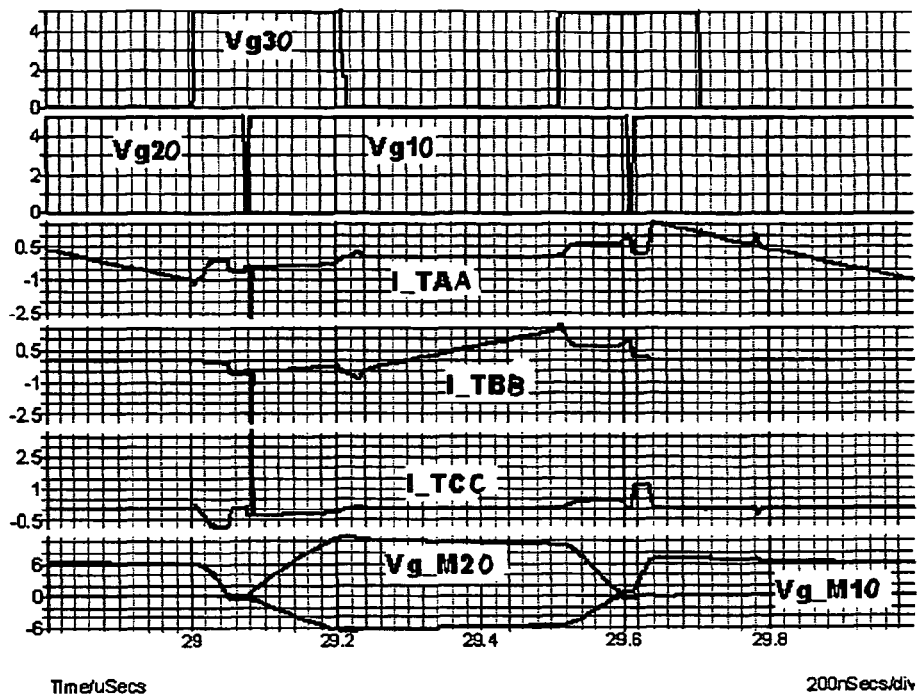
FIG. 14 is a plot of the results of a simulation of the resonant gate drive circuit of FIG. 12 for a switching frequency fs=1 MHz.

A computer simulation was performed on the resonant gate drive circuit of FIG. 12. The simulation conditions included: source voltage Vcc was 5 V, switching frequency was 1 MHz, magnetizing inductances were 800 nH. A 5 nF capacitor was used to simulate the equivalent gate capacitance of the MOSFETs. The simulation assumed no leakage inductance. Simulation results are shown in FIG. 14, wherein it can be seen that the simulated circuit performed as expected.

In addition, an experimental circuit was built based on a 50% duty cycle Buck converter. The input voltage was 10 V and the supply voltage Vcc was 5 V. The clock frequency was 1 MHz. The logic control circuit was built using discrete gate components. A toroid core transformer (T44-15) from Micrometals was used for the centre-tapped transformer in which a bifilar wire winding construction was employed to minimize the leakage inductance of transformer. The magnetizing inductance was 800 nH. The turns ratio was 1:1:1.2, with winding TCC (see FIG. 12) having more turns. The power MOSFET was FDS8896 (Fairchild) with 50 nC total charge. MOSFETs with small total gate charge were chosen for S1 to S3, where FDN335N from Fairchild was selected for S10, S20 and FDN308P was selected for S30.

Figure 15:
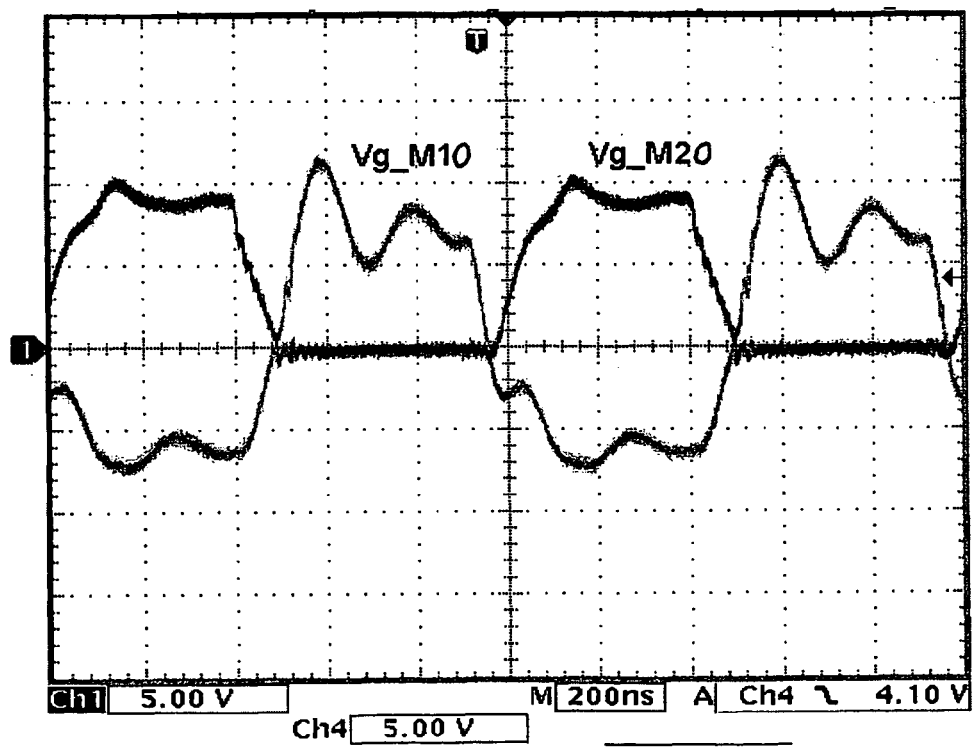
FIG. 15 is a plot of experimental results for the resonant gate drive circuit of FIG. 12 with fs=1 MHz.

FIG. 15 shows experiment results. Vg_M20 was driven to about two times the supply voltage Vcc. In the experimental circuit, leakage inductance resonated with the gate capacitance of M10 to drive the gate voltage, where the minimal gate voltage Vg_M10 was about 5 V, sufficient for control of a MOSFET. The gate voltage Vg_M10 settled at about 6 V. From measures of the experimental circuit performance, the gate drive loss saving was calculated to be 46.1%, the total gate loss was 636 mW, and the resonant drive circuit loss was 343 mW. Thus, in addition to reducing gate loss, the resonant gate drive circuit may also reduce switching loss due to fast transition times.

The contents of all cited patents, patent applications, and publications are incorporated herein by reference in their entirety.

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

REFERENCES

[1] K. Yao, F. C. Lee, "A novel resonant gate driver for high frequency synchronous buck converters," *IEEE Transactions on Power Electronics*, Vol. 17, No. 2, March 2003, pp. 180-186.

[2] D. Maksimovic, "A MOS gate drive with resonant transitions," in *Proc. IEEE PESC'91 Conf.*, 1991, pp. 527-532.

[3] Y. Panov, M. M. Jovanovic, "Design considerations for 12-V/1.5-V, 50-A voltage regulator modules," *IEEE Transactions on Power Electronics*, November 2001, pp. 776-783.

[4] S. H. Weinberg, "A novel lossless resonant MOSFET driver," in *Proc. IEEE PESC'92 Conf.*, 1992, pp. 1003-1010.

[5] J. Diaz, M. A. Perez, F. M. Linera, F. Aldana, "A new lossless power MOSFET driver based on simple DC/DC converters," in *Proc. IEEE PESC'95 Conf.*, 1995, pp. 37-43.

[6] J. Diaz, M. A. Perez, F. J. Linera, F. Nuno, "A new family of loss-less power MOSFET drivers," in *Power Electronics Congress Proceedings* (*CIEP*), 1994, pp. 43-48.

[7] Y. Chen, F. C. Lee, L. Amoroso, H. Wu, "A resonant MOSFET gate driver with efficient energy recovery," *IEEE Transactions on Power Electronics*, Vol. 19, No. 2, March 2004, pp. 470-477.

[8] B. S. Jacobson, "High frequency resonant gate drive for a power MOSFET," in *High Frequency Power Conversion Conference* (*HFPC*), 1993, pp. 133-141.

The invention claimed is:

1. A resonant gate drive circuit for controlling operation of at least one power switching device having a gate capacitance, comprising:
   a first input terminal for receiving a supply voltage;
   a first current source having a first terminal and a second terminal;
   a second current source having a first terminal and a second terminal;
   wherein the second terminal of the first current source and the first terminal of the second current source are connected together at a node, the at least one power switching device being connected to the first terminal of the first current source or the second terminal of the second current source; and
   a plurality of switches that direct the flow of current from the first current source and the second current source, to charge and discharge the gate capacitance of the at least one power switching device, and that connect the gate capacitance of the at least one power switching device to a voltage higher than the supply voltage or to a low voltage, at a selected instant in time;
   wherein operation of the at least one power switching device is controlled.

2. The resonant gate drive circuit of claim 1, further comprising a first power switching device connected at its gate capacitance to the first current source and a second power switching device connected at its gate capacitance to the second current source.

3. The resonant gate drive circuit of claim 1, wherein the first and second current sources are first and second windings of a transformer, and the node is a centre-tap of the transformer.

4. The resonant gate drive circuit of claim 1, wherein the low voltage is approximately ground of the circuit.

5. The resonant gate drive circuit of claim 1, wherein the low voltage is equal to or less than that required to maintain the at least one power switching device in an off-state.

6. The resonant gate drive circuit of claim 1, wherein the at least one power switching device comprises a plurality of power switching devices connected in parallel.

7. The resonant gate drive circuit of claim 1, wherein:
   a first switch is connected between circuit ground and the first current source;
   a second switch is connected between circuit ground and the second current source; and
   a third switch is connected between the node and the supply voltage.

8. The resonant gate drive circuit of claim 7, further comprising:
   first and second power switching devices connected in series between a second input terminal and circuit ground; and
   a third current source connected between the gate capacitance and the source of the first power switching device;
   wherein the gate capacitance of the second power switching device is connected between the first switch and the first current source or between the second switch and the second current source.

9. The resonant gate drive circuit of claim 8, wherein the first, second, and third current sources are first, second, and third windings of a transformer, and the node is a centre-tap of the transformer.

10. The resonant gate drive circuit of claim 7, further comprising:
    first and second power switching devices connected in series between a second input terminal and circuit ground;
    a third current source connected between the gate capacitance and the source of the first power switching device;
    third and fourth power switching devices connected in series between a third input terminal and circuit ground; and
    a fourth current source connected between the gate capacitance and the source of the third power switching device;
    wherein the gate capacitance of the second power switching device is connected between the first switch and the first current source, and the gate capacitance of the fourth power switching device is connected between the second switch and the second current source.

11. The resonant gate drive circuit of claim 10, wherein the first, second, third, and fourth current sources are first, second, third, and fourth windings of a transformer, and the node is a centre-tap of the transformer.

12. The resonant gate drive circuit of claim 1, wherein the at least one power switching device is selected from the group consisting of MOSFET, IGBT, and MCT.

13. The resonant gate drive circuit of claim 1, wherein the at least one power switching device is MOSFET.

14. The resonant gate drive circuit of claim 1, wherein the gate capacitance is charged through a first low impedance path and is discharged through a second low impedance path.

15. The resonant gate drive circuit of claim 1, wherein the gate capacitance is charged with a constant current.

16. A method of controlling operation of at least one power switching device having a gate capacitance, comprising:
    (i) charging the gate capacitance of a power switching device using at least a portion of a magnetizing inductance current, so that the power switching device is switched on;
    (ii) using a current source to generate a voltage that is higher than a supply voltage, and then clamping the gate capacitance of the power switching device to the high voltage while the power switching device is on;
    (iii) discharging the gate capacitance of the power switching device using at least a portion of a magnetizing inductance current so that the power switching device is switched off, and then clamping the gate capacitance of the power switching device to a low voltage while the power switching device is off; and
    (iv) repeating steps (i) to (iii) as required to control operation of the at least one power switching device.

17. The method of claim 16, further comprising:
    carrying out steps (i) to (iv) on first and second power switching devices alternately such that the first and second power switching devices are not on simultaneously.

18. The method of claim 16, wherein clamping the gate capacitance of the power switching device to a low voltage comprises clamping the gate capacitance approximately to ground of the circuit.

19. The method of claim 16, wherein clamping the gate capacitance of the power switching device to a low voltage comprises clamping the gate capacitance to a voltage that is equal to or less than that required to maintain the power switching device in an off-state.

20. The method of claim 16, wherein clamping the gate capacitance of the power switching device to a high voltage comprises clamping the gate capacitance to a voltage that is approximately two times the supply voltage.

21. The method of claim 16, further comprising:
charging the gate capacitance via a first low impedance path; and
discharging the gate capacitance via a second low impedance path.

22. The method of claim 16, wherein the magnetizing inductance current is produced using a transformer

* * * * *